(12) United States Patent
Zhou et al.

(10) Patent No.: US 10,711,340 B2
(45) Date of Patent: Jul. 14, 2020

(54) BAFFLE DEVICE FOR EVAPORATION APPARATUS AND EVAPORATION APPARATUS

(71) Applicants: BOE TECHNOLOGY GROUP CO., LTD., Beijing (CN); Chengdu BOE Optoelectronics Technology Co., Ltd, Chengdu, Suchuan Province (CN)

(72) Inventors: Da Zhou, Beijing (CN); Zailong Mo, Beijing (CN); Qun Ma, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 457 days.

(21) Appl. No.: 15/821,065

(22) Filed: Nov. 22, 2017

(65) Prior Publication Data
US 2018/0305804 A1    Oct. 25, 2018

(30) Foreign Application Priority Data

Apr. 20, 2017 (CN) .......................... 2017 1 0262126

(51) Int. Cl.
*C23C 16/00* (2006.01)
*C23C 14/24* (2006.01)
*B01F 3/04* (2006.01)
*C23C 14/54* (2006.01)
*H05B 33/10* (2006.01)

(52) U.S. Cl.
CPC ........ *C23C 14/246* (2013.01); *B01F 3/04524* (2013.01); *C23C 14/24* (2013.01); *C23C 14/54* (2013.01); *C23C 14/542* (2013.01); *H05B 33/10* (2013.01)

(58) Field of Classification Search
CPC .......................... B01F 3/04524; C23C 14/246
See application file for complete search history.

(56) References Cited

U.S. PATENT DOCUMENTS

2013/0239891 A1* 9/2013 Sonoda ................. C23C 14/042
                                                                  118/719
2014/0227443 A1* 8/2014 Hoffmann ........... C23C 14/0021
                                                                  427/248.1

* cited by examiner

*Primary Examiner* — Keath T Chen
(74) *Attorney, Agent, or Firm* — Kinney & Lange, P.A.

(57) ABSTRACT

The present disclosure provides a baffle device for an evaporation apparatus and the evaporation apparatus. The baffle device includes a baffle assembly, configured to separate an evaporation ejection source from a substrate when the substrate is being switched in the evaporation apparatus; and at least one collection device, provided below the baffle assembly, and configured to collect evaporation material falling down from the baffle assembly.

17 Claims, 6 Drawing Sheets

BAFFLE DEVICE FOR EVAPORATION APPARATUS AND EVAPORATION APPARATUS

CROSS-REFERENCE TO RELATED APPLICATION

This application claims priority of Chinese Patent Application No. 201710262126.X entitled with "Baffle Device for Evaporation Apparatus and Evaporation apparatus" filed on Apr. 20, 2017 in the State Intellectual Property Office of China, the disclosure of which is incorporated in its entirety herein by reference.

BACKGROUND

Technical Field

The present disclosure relates to a field of evaporation technology, and more particularly, to a baffle plate for an evaporation apparatus and the evaporation apparatus using the same.

Description of the Related Art

During the manufacturing process of an organic light emitting panel, it is necessary to manufacture an organic light emitting layer on a substrate by a vacuum evaporation method which is widely used. When switching different substrates during the evaporation process, in order to avoid an evaporating material from being deposited on a wall of chamber of the evaporation apparatus, it is common to separate the substrate from an evaporation ejection source by a baffle plate, move out the baffle plate after finishing the replacement of the substrate, and then continue to evaporate a new substrate.

SUMMARY

The present disclosure aims to at least partially solve one of the technical problems mentioned in the background. To this end, the present disclosure provides a baffle device for an evaporation apparatus and the evaporation apparatus including the baffle device.

In one aspect of the present disclosure, it provides a baffle device for an evaporation apparatus, comprising:

a baffle assembly, configured to separate an evaporation ejection source from a substrate when the substrate is being switched in the evaporation apparatus;

at least one collection device, provided below the baffle assembly, and configured to collect evaporation material falling down from the baffle assembly.

In one example, the at least one collection device is provided with a guide face for directing the evaporation material ejected from the evaporation ejection source towards the baffle assembly.

In one example, each of the at least one collection device comprises:

a connecting rod, an upper end of which is connected to the baffle assembly;

a guiding portion, fixed to a lower end of the connecting rod, wherein an upper surface of the guiding portion defines an accommodating space for collecting the evaporation material, and a lower surface of the guiding portion is configured as the guide face.

In one example, the guiding portion is shaped into a substantially inverted cone or bowl.

In one example, the guiding portion is coaxial or eccentric with respect to the connecting rod.

In one example, a radial distance between the guide face of the guiding portion and the connecting rod is adjustable.

In one example, the collection device further comprises:

a first sleeve, jacketing the connecting rod so as to be movable up and down;

a plurality of support bars, an inner end of each support bar being pivotally connected to the lower end of the connecting rod, and the plurality of support bars being radially distributed and supported on the upper surface of the guiding portion;

a plurality of connecting bars, provided in one-to-one correspondence with the plurality of support bars, wherein one end of each connecting bar is pivotally connected to the corresponding support bar and the other end of the connecting bar is pivotally connected to a lower end of the first sleeve.

In one example, a plurality of first fixation holes are provided in the connecting rod along a longwise direction of the connecting rod and uniformly spaced apart from each other;

a second fixation hole is disposed in a side wall of the first sleeve;

when the first sleeve is moved up and down with respect to the connecting rod, the second fixation hole corresponds to one of the first fixation holes, and a fixation member in turn passes through the second fixation hole and the first fixation hole so as to fix the first sleeve to the connecting rod.

In one example, the guiding portion is elastic, and the collection device further comprises:

a second sleeve movably jacketing the connecting rod in an upper and lower direction; and a plurality of connecting plates, a first end of each connecting plate being connected to a lower end of the second sleeve, and the plurality of connecting plates being radially distributed, wherein a second end of each connecting plate is connected with the guiding portion.

In one example, a plurality of first fixation holes are provided in the connecting rod along a longwise direction of the connecting rod and uniformly spaced apart from each other;

a third fixation hole disposed in a side wall of the second sleeve;

when the second sleeve is moved up and down with respect to the connecting rod, the third fixation hole corresponds to one of the first fixation holes, and a fixation member in turn passes through the third fixation hole and the first fixation hole so as to fix the second sleeve to the connecting rod.

In one example, a plurality of the collection devices are provided, the plurality of the collection devices comprising a plurality of first collection devices and a plurality of second collection devices, wherein a radial distance between the guide face of the guiding portion of the first collection device and the connecting rod is not equal to a radial distance between the guide face of the guiding portion of the second collection device and the connecting rod, and the first collection devices and the second collection devices are arranged alternately on the baffle assembly.

In one example, a plurality of the collection devices are provided on the baffle assembly and spaced apart from each other, wherein a radial distance between the guide face of the guiding portion of the collection device closer to a center of the baffle assembly and the connecting rod is larger than a radial distance between the guide face of the guiding portion of the collection device further from the center of the baffle assembly and the connecting rod.

In one example, extension directions of the connecting rods of the collection devices are configured to be different from each other and the connecting rod of each of the collection devices is eccentric with respect to the guiding portion.

In one example, the connecting rod is rotatably provided on the baffle assembly and an angle between the connecting rod and the baffle assembly is adjustable.

In one example, each collection device further comprises an adjustment rod, one end of which is fixed to the connecting rod and the other end of which is connected to the baffle assembly and is rotatable along a circumferential direction of the connecting rod, and an extension length of the adjustment rod is adjustable.

In one example, the adjustment rod comprises:

a first adjustment portion of a hollow shape, one end of the first adjustment portion being fixed to the connecting rod; and a second adjustment portion, one end of the second adjustment portion being connected to the baffle assembly and rotatable along the circumferential direction of the connecting rod, and the other end of the second adjustment portion is fitted in the first adjustment portion and in slidable fit with the first adjustment portion.

In one example, a length of the connecting rod is adjustable, and the connecting rod comprises a first connecting segment and a second connecting segment, wherein an accommodating slot is provided in the second connecting segment and a lower end of the first connecting segment is slidably fitted in the accommodating slot, so that the length of the connecting rod is adjusted by adjusting a length of the first adjustment segment in the accommodating slot, and after the length of the connecting rod is fixed, the first connecting segment is fixed to the second connecting segment by a fastener.

In one example, the baffle assembly comprises a baffle plate.

In one example, the baffle assembly further comprises a fixation frame, the baffle plate is provided on top of the fixation frame; and the fixation frame is provided with a plurality of mesh holes, two adjacent ones of which are spaced apart by a connecting rib.

In another aspect of the present disclosure, it also provides an evaporation apparatus comprising:

an evaporation box, in which an evaporation chamber and an accommodating chamber are provided and spaced apart from each other;

an evaporation ejection source, located within the evaporation chamber and used for ejecting evaporation material; and the baffle device for the evaporation apparatus as described above.

BRIEF DESCRIPTION OF THE DRAWINGS

The above and additional aspects and advantages of the present disclosure will become apparent and readily understood from the description with reference to the drawings below, in which.

DETAILED DESCRIPTION OF EMBODIMENTS

Figure 1:
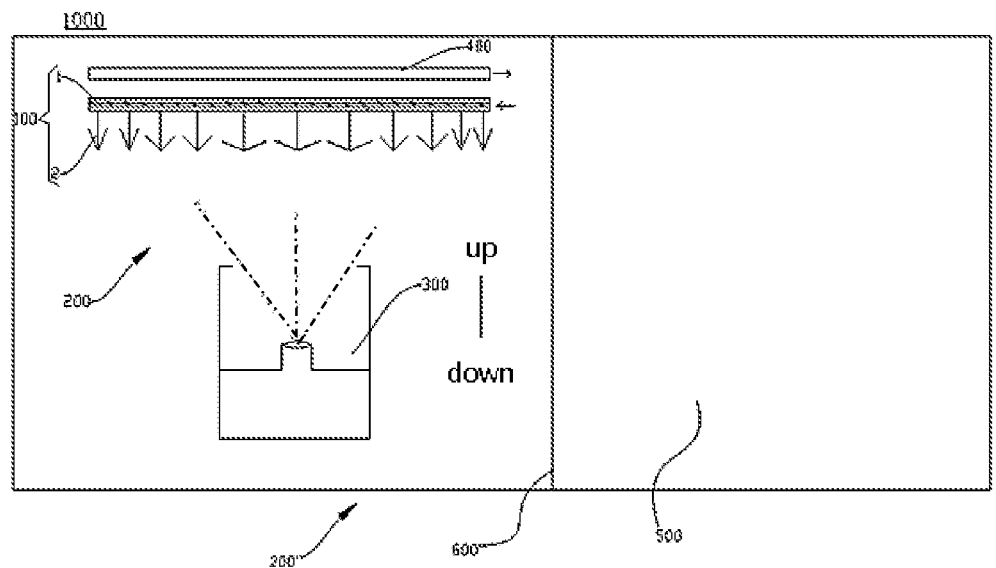
FIG. 1 is a schematic view showing a part of structure of an evaporation apparatus in accordance with an embodiment of the present disclosure.

Below, embodiments of the present disclosure will be described, and examples of the embodiments are shown in the drawings in which the same or similar reference numerals indicate the same or similar elements or the elements having the same or similar function throughout the specification. The embodiments which are described in the following with reference to the drawings are illustrative and only used to explain the disclosure, rather than being interpreted as a limiting to the present disclosure.

For sake of brevity of description below, it should be understandable in the description of the present disclosure that once being used, terms "center", "longitudinal", "lengthwise", "upper", "lower", "front", "rear", "left", "right", "vertical", "horizontal", "top", "bottom", "inner", "outer", "axial", "radial", and "circumferential" or the like are used to indicate the orientation or positional relationship, which are based on the orientation or positional relationship shown in the drawings. These are only used to describe the present disclosure conveniently and simplify the description, rather than meaning or implying the mentioned device or element must have a particular orientation, or be configured and operated in a particular orientation. Due to this, they could not be understood as one kind of limiting to the present disclosure. In addition, the features defined by "first", "second" or the like can explicitly indicate or imply include one or more of such features. In the description of the present disclosure, the term "plural" means two or more than two, unless specified otherwise.

In the description of the present disclosure, it should be noted that terms "connected", "connecting" or "connection" should be broadly understood, for example to be fixedly connected, or detachably connected, or integrally connected; to be mechanically connected, electrically connected; or directly connected or indirectly connected by means of an intermediate medium; or should be understood as a communication within the two elements. The specific meanings of the above terms in the present disclosure can be understood by those skilled in the art as actually required.

When the baffle plate is used in a vacuum evaporation process to avoid the evaporation material from being deposited on a wall of chamber of the evaporation apparatus, since the baffle plate is repeatedly used, as the evaporation time increases, the evaporation material on the baffle plate is easily fallen down, and there is a risk of blocking the evaporation ejection source, thereby affecting uniformity of organic light emitting layer film and further influencing the display quality of the organic light emitting panel.

In order to at least partially solve the above mentioned technical problem, an embodiment of the present disclosure provides a baffle device for the evaporation apparatus and an evaporation apparatus using such a baffle apparatus.

With reference to FIGS. 1-9, it depicts a baffle device 100 for an evaporation apparatus 1000 and its relevant devices in accordance with an embodiment of the present disclosure.

Figure 2:
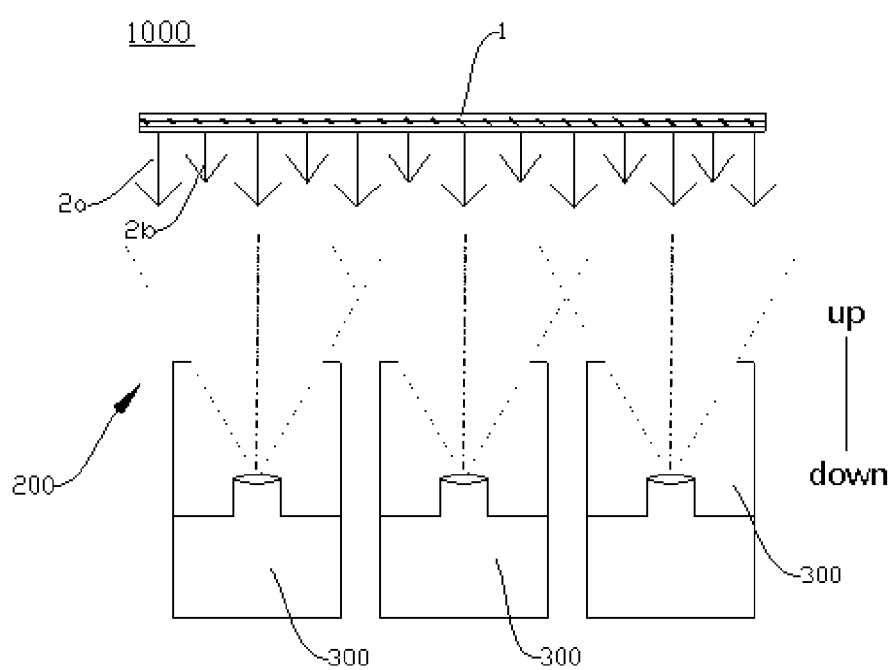
FIG. 2 is a schematic view showing a part of structure of an evaporation apparatus in accordance with another embodiment of the present disclosure.
Figure 3:
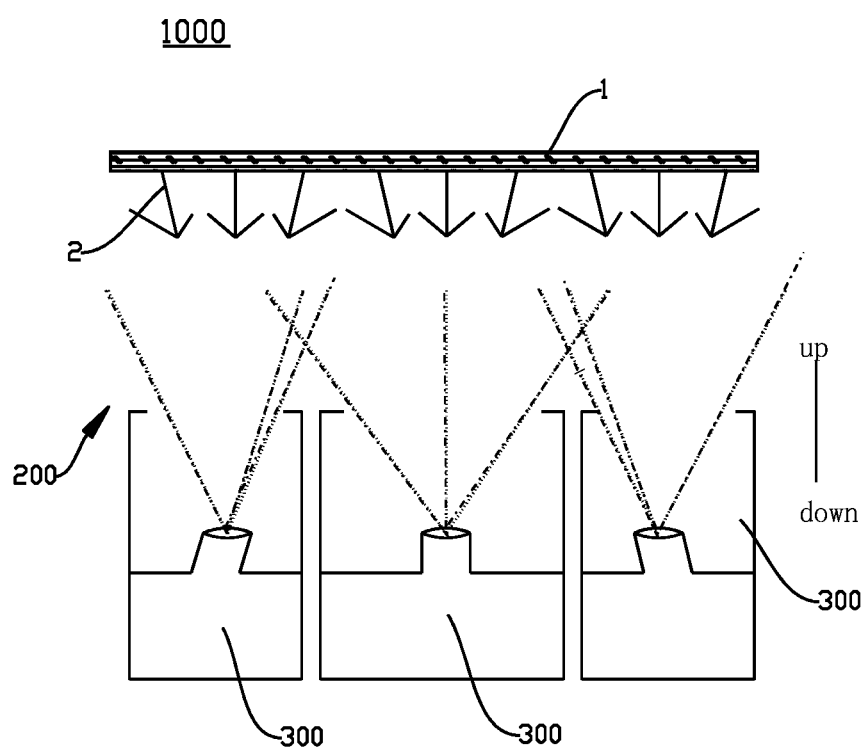
FIG. 3 is a schematic view showing a part of structure of an evaporation apparatus in accordance with a further embodiment of the present disclosure.

Firstly, FIGS. 1-3 show an evaporation apparatus 1000 in accordance with an embodiment of the present disclosure. Specifically, as shown in FIGS. 1-3, the evaporation apparatus 1000 includes an evaporation box 200', an evaporation ejection source 300 and a baffle device 100. The evaporation box 200' have an evaporation chamber 200 and an accommodating chamber 500 separated from each other therein. In other words, the evaporation chamber 200 and the accommodating chamber 500 both are provided within the evaporation box 200' and are separated from each other. For example, a baffle plate 600 is provided in the evaporation box 200', and vertically placed so as to divide a space in the evaporation box 200' into the evaporation chamber 200 and the accommodating chamber 500.

As shown in FIGS. 1-3, the evaporation ejection source 300 is located in the evaporation chamber 200 to eject evaporation material. Specifically, when an evaporation process is performed to a substrate 400 by the evaporation apparatus 1000, the evaporation material (shown by a dash line in FIG. 1) ejected by the evaporation ejection source 300 can be deposited on a surface of the substrate 400. Optionally, an ejection angle of the evaporation material which is ejected out from the evaporation ejection source 300 is adjustable. For example, an ejection nozzle of the evaporation ejection source 300 is rotatable to adjust the ejection angle. Alternatively, in other embodiments, the evaporation ejection source 300 is movable (for example rotates or reciprocates) so as to adjust the ejection angle. Therefore, it is beneficial to improve the evaporation effect for the substrate 400.

As shown in FIGS. 1-3, the baffle device 100 in accordance with an embodiment of the present disclosure can include a baffle assembly 1 and at least one collection device 2. That is, one or more collection devices are provided herein. The word "more" herein means two or more than two.

Figure 8:
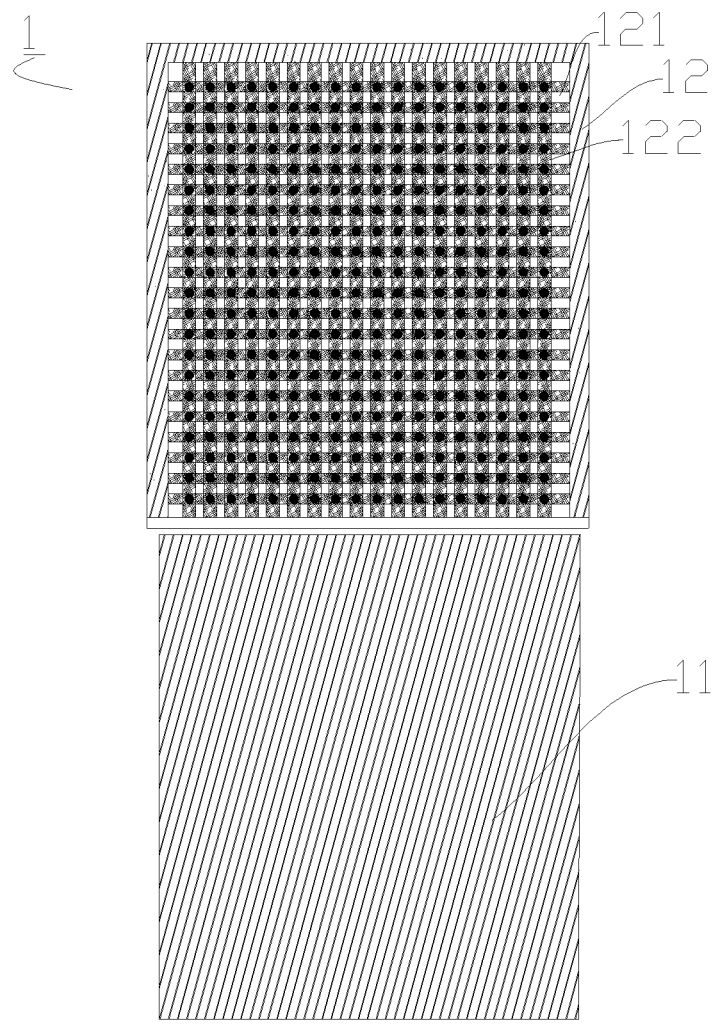
FIG. 8 is a schematic view of a baffle assembly in accordance with an embodiment of the present disclosure.
Figure 9:
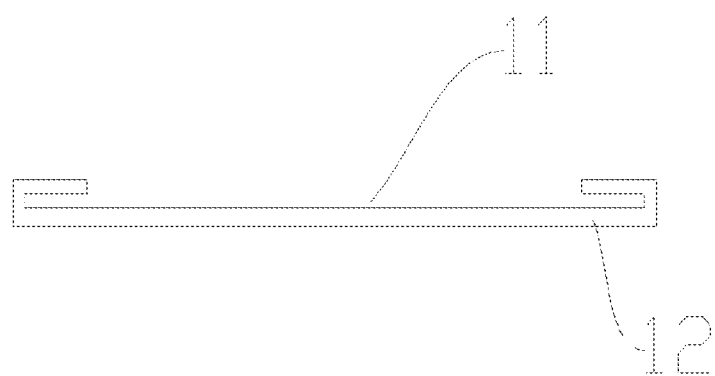
FIG. 9 is a schematic view of a baffle assembly in accordance with an embodiment of the present disclosure viewing from another direction.

Specifically, as shown in FIGS. 8-9, the baffle assembly 1 includes a baffle plate 11, which is used to separate the evaporation ejection source 300 and the substrate 400 from each other upon switching the substrates 400. For example, when the evaporation process is performed to the substrate 400, the baffle assembly 1 is received in the accommodating chamber 500. When switching a different substrate 400, the baffle assembly 1 is moved from the accommodating chamber 200 into the evaporation chamber 200, so as to separate the substrate 400 and the evaporation ejection source 300 from each other by means of the baffle plate 11, so that it can avoid the evaporation material ejected out from the evaporation ejection source 300 from being ejected onto an inner wall of the evaporation chamber 200.

Specifically, when the surface of the substrate 300 is processed by an evaporation process, the baffle assembly 1 is received in the accommodating chamber 500, and the baffle plate 400 is located above the evaporation ejection source 300. In this way, the evaporation material ejected out from the evaporation ejection source 300 can be directly directed toward the substrate 400 so as to be deposited on the substrate 400. When finishing the evaporation process for the substrate 400 and needing to switch by a different substrate 400, i.e., it is necessary to switch the plated substrate 400 into a substrate 400 to be plated, it can firstly move the baffle assembly 1 from the accommodating chamber 500 into the evaporation chamber 200; after the evaporation ejection source 300 and the plated substrate 400 are separated by the baffle plate 11, the plated substrate 400 may be switched by a substrate 400 to be plated; and when the substrate 400 to be plated is assembled and it is necessary to process the substrate 400 to be plated, that is, the switching operation is ended, the baffle assembly 1 is moved from the evaporation chamber 200 into the accommodating chamber 500, so as to process the substrate 400 to be plated.

The collection device 2 is provided below the baffle assembly 1. Herein, the fixation means between the collection device 2 and the baffle assembly 1 is selective, for example, the collection device 2 is detachably connected to the baffle assembly 1, or the collection 2 is non-detachably connected to the baffle assembly 1.

When switching a different substrate 400, the collection device 2 is used to collect the evaporation material falling down from the baffle plate 11. Specifically, due to the long period of repetitive use, under the action of the self-gravity or the impact force of a gas flow ejected out from the evaporation ejection source 300, the evaporation material deposited on the baffle plate 11 is easily fallen down. Therefore, at this time, the collection device 2 can collect the evaporation material falling down from the baffle plate 11, thereby avoiding the evaporation material on the baffle plate 11 from blocking the evaporation ejection source 300 due to falling down into the area surrounding the evaporation ejection source 300, and influencing the uniformity of the plated layer of the substrate 400 due to the blocking or partially blocking of the evaporation ejection source 300. Thus, the present disclosure can further improve the display quality of the organic light emitting panel.

Figure 4:
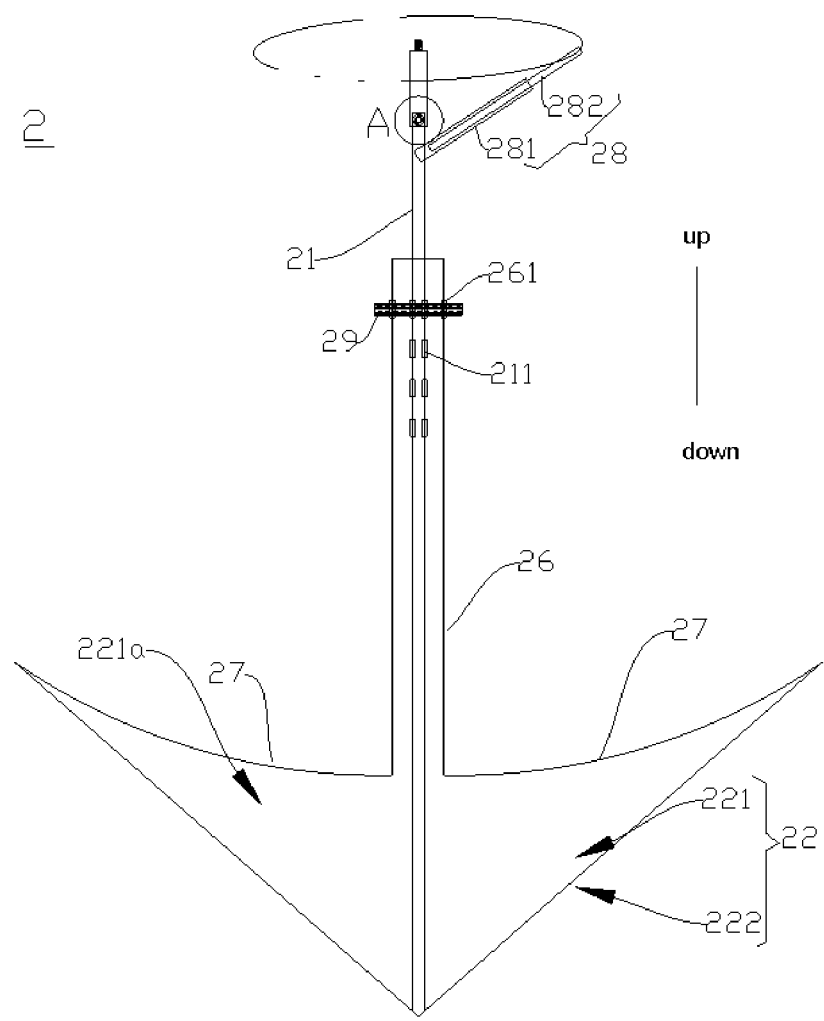
FIG. 4 is a schematic view of a collection device in accordance with an embodiment of the present disclosure.
Figure 6:
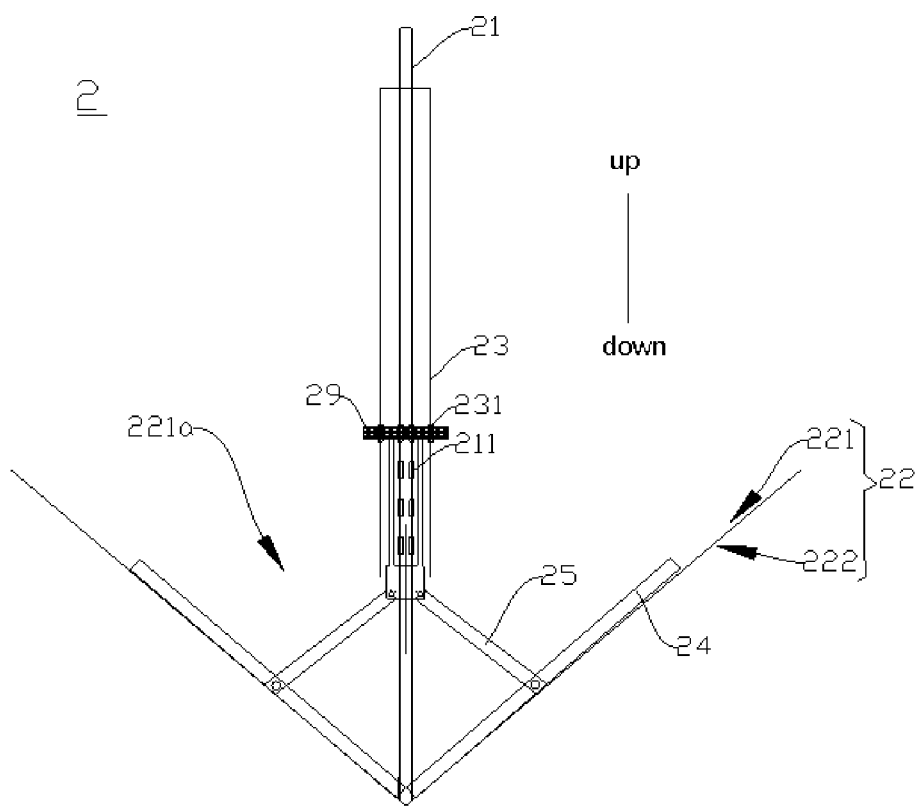
FIG. 6 is a schematic view of a collection device in accordance with another embodiment of the present disclosure.

As shown in FIGS. 4 and 6, each collection device 2 has a guide face 222 for directing the evaporation material ejected from the evaporation ejection source 300 to the baffle plate 11, and thus the use of the guide face 222 to direct the evaporation material ejected from the evaporation ejection source 300 to the baffle plate 11 is beneficial to attach more evaporation material to a region of the baffle plate 11 located above the collection device 2. In this way, once the evaporation material on the baffle plate 11 falls down, it will be collected by the collection device 2 while not blocking the evaporation ejection source 300.

With the baffle device 100 for the evaporation apparatus 1000 in accordance with the embodiments of the present disclosure, by providing the collection device 2 which has a guide face 222 for guiding the evaporation material ejected out from the evaporation ejection source 300 to the baffle plate 11, at the time of switching a different substrate 400, the guide face 222 can direct more evaporation material to the baffle plate 11 and such evaporation material can coat a region of the baffle plate 11 above the collection device 2. In this way, the evaporation material falling down from the baffle plate 11 can be directly collected by the collection device 2, and would not fall down into a space of the evaporation chamber 200 outside the collection device 2, so that it can avoid the evaporation material on the baffle plate 11 from blocking the evaporation ejection source 300 due to falling down into the area surrounding the evaporation ejection source 300, and influencing the uniformity of the plated layer of the substrate 400 due to the blocking or partially blocking of the evaporation ejection source 300. Thus, the present disclosure can further improve the display quality of the organic light emitting panel, and meanwhile facilitate the recycle and utilization of the evaporation material collected by the collection device 2. In this way, it can save the cost and benefit lengthening the lifetime of the baffle plate 11.

Optionally, as shown in FIGS. 8 and 9, the baffle assembly 1 further includes a fixation frame 12, on top of which the baffle plate 11 is fixed. The fixation frame 12 has a plurality of mesh holes 121, and two adjacent mesh holes 121 are spaced apart from each other by means of a connecting rib 122. Thus, the fixation frame 12 has simple structure and facilitates fixing the collection device 2 to a bottom of the fixation frame 12.

Specifically, the baffle plate 11 can be slidably provided on a top of the fixation frame 12, and after a long time service, it is convenient to detach the baffle plate 11 from the fixation frame 12, so as to easily replace the baffle plate 11.

Optionally, the collection device 2 is detachably fixed to the fixation frame 12, which facilitates the detachment of the collection device 2 and the recycling of the plating material collected by the collection device 2.

Figure 7:
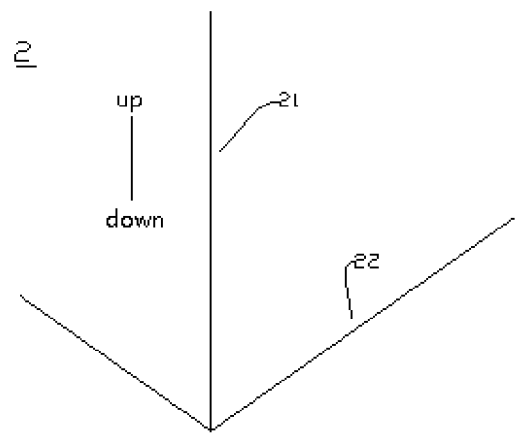
FIG. 7 is a schematic view of a collection device in accordance with a further embodiment of the present disclosure.

In accordance with some embodiments of the present disclosure, as shown in FIGS. 4, 6 and 7, each collection device 2 includes a connecting rod 21 and a guiding portion 22. Specifically, an upper end of the connecting rod 21 is connected to the baffle assembly 1, and the guiding portion 22 is fixed to a lower end of the connecting rod 21.

For example, the upper end of the connecting rod 21 is connected to the above fixation frame 12, and the guiding portion 22 is fixed to a lower end of the connecting rod 21. Alternatively, the upper end of the connecting rod 21 is connected to a bottom wall of the baffle plate 11, and the guiding portion 22 is fixed to the lower end of the connecting rod 21.

Optionally, as shown in FIGS. 4 and 6, the guiding portion 22 is provided to be coaxial with the connecting rod 21, or a gravity center of the guiding portion 22 is located at a central axis of the connecting rod 21. Therefore, it is not only simple in structure but also beneficial to optimize the appearance of the collection device 2. Of course, in other examples of the present disclosure, there might be other connecting means between the guiding portion 22 and the connecting rod 21, for example as shown in FIG. 7, the guiding portion 22 is provided to be eccentric with respect to the connecting rod 21. Herein, it should be understandable that the eccentric setting of the guiding portion 22 with the connecting rod 21 is meant to the guiding portion 22 and the connecting rod 21 are located on different axes, or the gravity center of the guiding portion 22 is not on the central axis of the connecting rod 21. Specifically, as shown in FIGS. 4 and 6, an upper surface 221 of the guiding portion 22 defines an accommodating space 221a for collecting the evaporation material, and the lower surface 222 of the guiding portion 22 is configured as the guide face 222. In other words, the guiding portion 22 has an upper surface 221 and a lower surface 222, and the upper surface 221 of the guiding portion 22 defines the accommodation space 221a which can be used to accommodate the evaporation material falling down from the baffle plate 11. The lower surface 222 of the guiding portion 22 is configured as the guide face 222 which is used to direct the evaporation material to the baffle plate 11. For example, the guiding portion 22 is shaped into a substantially inverted cone (for example circular cone), and thus the guiding portion 22 has the accommodating space 221a which is formed by an open bottom (at a side which is opposite to a vertex thereof) and the conical surface of the guiding portion 22 is formed as the guide face 222. In another example, the guiding portion 22 can also be formed into a shape of bowl, and thus an outside arc-surface of the bowl is formed as the guide face 222 and an inner surface of the bowl defines the accommodating space 221a. In a further example, the guiding portion 22 can also be shaped into an open hemisphere, an outside spherical surface of the hemisphere is the guide face 222, and the inner surface at the side which is open defines the accommodating space 221a.

Optionally, a radial distance between the guide face of the guiding portion 22 and the connecting rod 21 is adjustable. The radial distance herein is meant to a radial distance of a certain reference point or a certain point on the guide face from the connecting rod.

Therefore, the radial distance between the guide face of the guiding portion 22 and the connecting rod 21 is adjusted, so that the extension direction of the guide face 222 is adjusted so as to direct more evaporation material to the region of the baffle plate 11 above the collection device 2, thereby improving the guiding effect of the guide face 222. Herein, it should be understandable that when the guiding portion 22 has a shape of a substantially inverted cone, the wall where the conical surface of the guiding portion 22 is located is the guide face.

For example, the guiding portion 22 is shaped into a circular cone, the guiding portion 22 and the connecting rod 21 are set to be coaxial, and the radial distance between the conical surface of the guiding portion 22 and the central axis of the guiding portion 22 is adjustable.

Of course, it should be understandable that it can also set the radial distance between the guide face of the guiding portion 22 and the connecting rod 21 to be non-adjustable, i.e., the radial distance between the guide face of the guiding portion 22 and the connecting rod 21 is fixed.

Specifically, as shown in FIG. 6, the collection device 2 further includes a first sleeve 23, a plurality of support bars 24 and a plurality of connecting bars 25. The first sleeve 23 can movably jacket the connecting rod 21 in an upper and lower direction, an inner end of each support bar 24 can be pivotally connected to the lower end of the connecting end 21, and the plurality of support bars 24 are radially distributed and supported on an upper surface 221 of the guiding portion 22. The plurality of connecting bars 25 are provided in one-to-one correspondence with the plurality of support bars 24, and one end of each connecting bar 25 can be pivotally connected to the corresponding support bar 24 and the other end of the connecting bar 25 is pivotally connected to the lower end of the first sleeve 23. Therefore, when the first sleeve 23 is moved up and down with respect to the connecting rod 21, one end of the each connecting bar 25 is rotatable with respect to the support bar 24, and the other end thereof is rotatable with respect to the first sleeve 23 so as to adjust the radial distance between the guide face of the guiding portion 22 and the connecting rod 21. In this way, it will adjust the extension direction of the guide face 222 so as to direct more evaporation material to the region of the baffle plate 22 above the collection device 2, and improve the guiding effect of the guide face 222.

Of course, the present disclosure is not limited to this. In other embodiments, the adjustment to the radial distance between the guide face of the guiding portion 22 and the connecting rod 21 can be implemented by other means. For example, as shown in FIG. 4, the collection device 2 further includes a second sleeve 26 and a plurality of connecting plates 27. The second sleeve 26 movably jackets the connecting rod 21 in an upper and lower direction. A first end of each connecting plate 27 can be connected to a lower end of the second sleeve 26, and the plurality of connecting plates 27 are radially distributed. A second end of each connecting plate 27 is connected with the guiding portion 22. In this way, when the second sleeve 26 is moved up and down and drives the connecting plate 27 to move up and down synchronously, the movement of the connecting plate 27 in an up and down direction drives the elastic guiding portion 22 to be deformed. In this way, it will adjust the extension direction of the guide face 222 so as to direct more evaporation material to the region of the baffle plate 11 above the collection device 2, and improve the guiding effect of the guide face 222.

Further, as shown in FIG. 6, the connecting rod 21 is provided with a plurality of first fixation holes 211 arranged along a longwise direction of the connecting rod 21 and uniformly spaced apart from each other. A second fixation hole 231 is disposed in a side wall of the first sleeve 23. When the first sleeve 23 is moved up and down with respect to the connecting rod 21, the second fixation hole 231 corresponds to one of the first fixation holes 211, and a fixation member 29 in turn passes through the second fixation hole 231 and the first fixation hole 211 so as to fix the first sleeve 23 to the connecting rod 21.

Specifically, when the fixation member 29 is removed from the first fixation hole 211 and the second fixation hole 231, the first sleeve 23 can be moved up and down with respect to the connecting rod 21; whereas when the first sleeve 23 moves to the position where the second fixation hole 231 correspondingly matches with one of the first fixation holes 211, the first sleeve 23 is fixed to the connecting rod 21 by using the fixation member 29 to pass through the second fixation hole 231 and the first fixation hole 211 in turn, so as to avoid the up-and-down movement of the first sleeve 23 with respect to the connecting rod 21 and to position the collection device 2. In a case that the substrate 400 needs to be switched, it is beneficial to the guiding of the guiding portion 22. Thereby, it is not only simple in terms of structure, but also easy to operate.

Of course, it should be understandable that the fixation between the second sleeve 26 and the connecting rod 21 may be similar to the fixation between the first sleeve 23 and the connecting rod 21. That is, the connecting rod 21 is provided with a plurality of first fixation holes 211 arranged along a longwise direction of the connecting rod 21 and uniformly spaced apart from each other. A third fixation hole 261 is disposed in a side wall of the second sleeve 26. When the second sleeve 26 is moved up and down with respect to the connecting rod 21, the third fixation hole 261 corresponds to one of the first fixation holes 211, and a fixation member 29 in turn passes through the third fixation hole 261 and the first fixation hole 211 so as to fix the second sleeve 26 to the connecting rod 21.

Optionally, the connecting rod 21 is rotatably provided on the baffle assembly 1 and the angle between the connecting rod 21 and the baffle assembly 1 can be adjustable. For example, an upper end of the connecting rod 21 is provided with a hook and the connecting rod 21 can be hooked on the connecting rib 122 of the fixation frame 12 as mentioned above. In another example, the connecting rib 122 of the fixation frame 12 is provided with a pivot hole within which the upper end of the connecting rod 21 is rotatably cooperated. In a further example, the bottom wall of the baffle plate 11 is provided with a pivot slot, within which the upper end of the connecting rod 21 can be rotatably cooperated. Therefore, the rotatable setting of the connecting rod 21 with respect to the baffle assembly 1 and the adjustment of the angle between the connecting rod 21 and the baffle assembly 1 can enable to adjust the extension direction of the guide face 222, and further adjust the guiding effect of the guide face 222.

Specifically, as shown in FIG. 4, each collection device 2 further includes an adjustment rod 28, one end of which is fixed to the connecting rod 21 and the other end of which is connected to the baffle assembly 1 and is rotatable along a circumferential direction of the connecting rod 21. For example, the fixation frame 2 is provided with an annular chute, the upper end of the connecting rod 21 is connected to a circular center of chute and the other end of the adjustment rod 28 is slidably fitted within the chute.

The extension length of the adjustment rod 28 is adjustable, and thus the other end of the adjustment rod 28 is rotated along the circumferential direction of the connecting rod 21. When the extension length of the adjustment rod 28 is adjusted, it can make the connecting rod 21 to incline toward any direction, so that the guiding portion 22 can in turn adjust the guiding effect of the guide face 222 as the incline of the connecting rod 21 is generated.

Optionally, as shown in FIG. 4, the adjustment rod 28 includes a first adjustment portion 281 of a hollow shape and a second adjustment portion 282. One end of the first adjustment portion 281 is fixed to the connecting rod 21, one end of the second adjustment portion 282 is connected to the baffle assembly 1 and rotatable along the circumferential direction of the connecting rod 21, and the other end of the second adjustment portion 282 is fitted in the first adjustment portion 281 and in slidable fit with the first adjustment portion 281. Therefore, the length of the adjustment rod 28 is adjusted by the slidable fit of the second adjustment portion 282 with the first adjustment portion 281, so that the extension direction of the guide face 222 is adjusted and further the guiding effect of the guide face 222 is adjusted. Of course, the present disclosure is not limited to this. In further embodiments, the first adjustment portion 281 can be in a pivotable fit with the second adjustment portion 282.

Optionally, the length of the connecting rod 21 is adjustable. Therefore, the distance between the guiding portion 22 and the baffle plate 11 is adjustable, so that it can function to adjust the guiding effect of the guiding portion 22.

Figure 5:
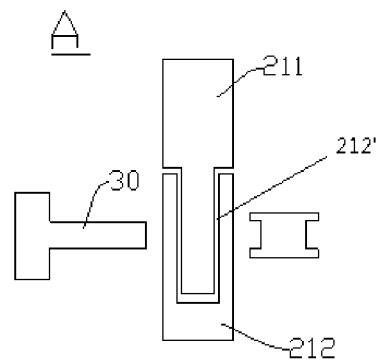
FIG. 5 is a cross-sectional enlarged view at a position A shown in FIG. 4.

For example, as shown in FIG. 5, the connecting rod 21 can include a first connecting segment 211 and a second connecting segment 212. An accommodating slot 212' is provided in the second connecting segment 212 and a lower end of the first connecting segment 211 is slidably fitted in the accommodating slot 212', so that the length of the connecting rod 21 is adjusted by adjusting a length of the first adjustment segment 211 in the accommodating slot 212', thereby optimizing the guiding effect of the guiding portion 22. Further, after the length of the connecting rod 21 is fixed, the first connecting segment 211 is fixed to the second connecting segment 212 by a fastener 30.

In some embodiments of the present disclosure, the evaporation apparatus 1000 further includes a heating member for heating the collection device 2. Therefore, the collection device 2 is heated by the heating member, when the evaporation material passes through the collection device 2, the heat of the collection device can be transferred to the evaporation material, and the evaporation material in form of gas can continue to flow upwardly, and flow to the baffle plate 11 finally. Therefore, it avoids the evaporation material from coating the collection device 2, and improves the guiding effect.

In some embodiments of the present disclosure, there are a plurality of collection devices 2, which include multiple first collection devices 2a and multiple second collection devices 2b. That is, among the collection devices 2, a part thereof are the first collection devices 2a and the other part thereof are the second collection devices 2b.

The radial distance between the guide face 222 of the guiding portion 22 of the first collection device 2a and the connecting rod 21 is not equal to the radial distance between the guide face 222 of the guiding portion 22 of the second collection device 2b and the connecting rod 21. For example, the radial distance between the guide face 222 of the guiding portion 22 of each collection device 2 and the connecting rod 21 is adjustable, and thus it is possible to directly adjust the radial distance between the guide face 222 of the guiding portion 22 of the first collection device 2a and the connecting rod 21 to be not equal to the radial distance between the guide face 222 of the guiding portion 22 of the second collection device 2b and the connecting rod 21. Also for example, the radial distance between the guide face 222 of the guiding portion 22 of each collection device 2 and the connecting rod 21 is non-adjustable, and thus during the manufacturing process, it is possible to directly produce the first collection device 2a and the second collection device 2b in such a way that the radial distance between the guide face 222 of the guiding portion 22 of the first collection device 2a and the connecting rod 21 is not equal to the radial distance between the guide face 222 of the guiding portion 22 of the second collection device 2b and the connecting rod 21. In another example, the radial distance between the guide face 222 of the guiding portion 22 of one of the first collection device 2a and the second collection device 2b and the connecting rod 21 is adjustable, while the radial distance between the guide face 222 of the guiding portion 22 of the other one of the first collection device 2a and the second collection device 2b and the connecting rod 21 is non-adjustable. In this way, the radial distance between the guide face 222 of the guiding portion 22 of the one collection device 2 and the connecting rod 21 which is designed to be adjustable is adjusted, so that the radial distance between the guide face 222 of the guiding portion 22 of the first collection device 2a and the connecting rod 21 is not equal to the radial distance between the guide face 222 of the guiding portion 22 of the second collection device 2b and the connecting rod 21.

Specifically, as shown in FIG. 2, when a plurality of evaporation ejection sources 300 are used and reciprocate within the evaporation chamber 200, as the movement of the evaporation ejection sources 300, the thickness of the evaporation material film on the baffle plate 11 presents a wave-shaped variation. The first collection devices 2a and the second collection devices 2b are alternated and arranged on the baffle assembly 1, so that the radial distance between the guide face 222 of the guiding portion 22 of the collection device 2 and the connecting rod 21 is larger at a position corresponding to a position where the thickness of the evaporation material film on the baffle plate 11 is larger, and similarly the radial distance between the guide face 222 of the guiding portion 22 of the collection device 2 and the connecting rod 21 is smaller at a position corresponding to a position where the thickness of the evaporation material film on the baffle plate 11 is smaller. This is advantageous to improve the guiding effect and the collecting effect to the evaporation material.

Further, as shown in FIG. 2, the connecting rod 21 of the first collection device 2a has a different length from that of the second collection device 2b. For example, the length of the connecting rod 21 of each collection device 2 is adjustable so that the lengths of the connecting rods 21 of the first collection device 2a and the second collection device 2b are different. In another example, the length of the connecting rod 21 of each collection device 2 is non-adjustable so that during the producing process, the lengths of the connecting rods 21 of the first collection device 2a and the second collection device 2b are different; or they are manufactured to have different lengths.

Optionally, there are a plurality of collection devices 2 which are spaced apart and provided on the baffle assembly 1.

Specifically, a spot type of evaporation ejection source 300 has a characteristic that the evaporation material on the baffle plate 11 at a region just above the evaporation ejection source 300 is denser than that at a region which deviates from the region just above the evaporation ejection source 300. That is, the evaporation material is more deposited on the baffle plate 11 at the region just above the evaporation ejection source 300, the risk of blocking caused by the falling of the evaporation material become larger at this region. As shown in FIG. 1, the radial distance between the guide face 222 of the guiding portion 22 of the collection device 2 closer to the center of the baffle assembly 1 and the connecting rod 21 is larger than the radial distance between the guide face 222 of the guiding portion 22 of the collection device 2 further from the center of the baffle assembly 1 and the connecting rod 21, which is not only beneficial to improve the guiding effect but also advantageous to avoid the blocking of the evaporation ejection source 300.

Optionally, when the plurality of the evaporation ejection sources 300 are used and eject different evaporation materials respectively, they reciprocate within the evaporation chamber 200 and have different ejection angles. As shown in FIG. 3, the extension directions of the connecting rods 21 of the collection devices 2 are different and the connecting rod 21 of each collection device 2 is eccentric with respect to the guiding portion 22. This is helpful to adjust the extension direction of the guide face 22 of the each collection direction 2 depending on the ejection angle of the evaporation ejection source 300, thereby improving the guiding effect and the collecting effect to the evaporation material.

With the baffle device for the evaporation apparatus in accordance with the embodiments of the present disclosure, the collection device is provided with a guide face for directing the evaporation material ejected from the evaporation ejection source to the baffle plate. When switching a different substrate, the guide face will direct more evaporation material to the baffle plate and the evaporation material will coat the baffle plate. In this way, the evaporation material falling down from the baffle plate can be directly collected by the collection device, rather than falling into the space of the evaporation chamber except the collection device. Therefore, this will avoid the blocking of the evaporation ejection source caused by the evaporation material from the baffle plate falling down into the surrounding areas of the evaporation ejection source, and can avoid influencing the uniformity of the plated layer on the substrate due to blocking or partially blocking the evaporation ejection source. In this way, it will better improve display quality of the organic light emitting panel and benefit the recycling and usage of the evaporation material collected by the collection device. It further saves the cost thereof and helps lengthen the service lifetime of the baffle plate.

With the evaporation apparatus in accordance with the embodiments of the present disclosure, the above described baffle device is provided herein. When switching a different substrate, the guide face will direct more evaporation material to the baffle plate and the evaporation material will coat the region of the baffle plate above the collection device. In this way, the evaporation material falling down from the baffle plate can be directly collected by the collection device, rather than falling into the space of the evaporation chamber except the collection device. Therefore, this will avoid the blocking of the evaporation ejection source caused by the evaporation material from the baffle plate falling down into the surrounding areas of the evaporation ejection source, and can avoid influencing the uniformity of the plated layer on the substrate due to blocking or partially blocking the evaporation ejection source. In this way, it will better improve display quality of the organic light emitting panel and benefit the recycling and usage of the evaporation material collected by the collection device. It further saves the cost thereof and helps lengthen the service lifetime of the baffle plate.

In the description of the present disclosure, reference terms "an embodiment", "one embodiment", "some embodiments", "illustrative embodiments", "examples", "specific examples" or "some examples" or the like used herein are meant to the specific features, structures, materials or characteristics described in such embodiments or examples are included in at least one embodiment or example of the present disclosure. In the present description, the illustrative mentions of the above terms are not necessarily to indicate the same embodiment or example. Furthermore, the described specific features, structures, materials or characteristics can be combined as appropriate in any one or more embodiments of the present disclosure.

Although embodiments of the present disclosure have been described and illustrated in detail with reference to the drawings, it will be understood by those skilled in the art that various changes, modifications, replacements and variants can be made to these embodiments of the present disclosure without departing from the principle and spirit of the embodiments of the present disclosure, and therefore the scope of the present disclosure shall be defined by the attached pending claims and theirs equivalents.

What is claimed is:

1. A baffle device for an evaporation apparatus, comprising:
   a baffle plate, configured to shield an evaporation ejection source from a substrate when the substrate is being loaded or unloaded to or from the evaporation apparatus; and
   at least one collection device, provided below the baffle plate, and configured to collect evaporation material falling down from the baffle plate;
   wherein the at least one collection device is provided with a guide face for directing the evaporation material ejected from the evaporation ejection source towards the baffle plate; and
   wherein each of the at least one collection device comprises:
      a connecting rod, an upper end of which is connected to the baffle plate; and
      a guiding portion, fixed to a lower end of the connecting rod, wherein an upper surface of the guiding portion defines an accommodating space for collecting the evaporation material, and a lower surface of the guiding portion is configured as the guide face.

2. The baffle device according to claim 1, wherein the guiding portion is shaped into a substantially inverted cone or bowl.

3. The baffle device according to claim 1, wherein the guiding portion is coaxial or eccentric with respect to the connecting rod.

4. The baffle device according to claim 3, wherein a length of the connecting rod is adjustable, and
   the connecting rod comprises a first connecting segment and a second connecting segment, wherein an accommodating slot is provided in the second connecting segment and a lower end of the first connecting segment is slidably fitted in the accommodating slot, so that the length of the connecting rod is adjusted by adjusting a length of the first adjustment segment in the accommodating slot, and after the length of the connecting rod is fixed, the first connecting segment is fixed to the second connecting segment by a fastener.

5. The baffle device according to claim 1, wherein a radial distance between the guide face of the guiding portion and the connecting rod is adjustable.

6. The baffle device according to claim 5, wherein the collection device further comprises:
   a first sleeve, jacketing the connecting rod so as to be movable up and down;
   a plurality of support bars, an inner end of each support bar being pivotally connected to the lower end of the connecting rod, and the plurality of support bars being radially distributed and supported on the upper surface of the guiding portion;
   a plurality of connecting bars, provided in one-to-one correspondence with the plurality of support bars, wherein one end of each connecting bar is pivotally connected to the corresponding support bar and the other end of the connecting bar is pivotally connected to a lower end of the first sleeve.

7. The baffle device according to claim 6, wherein a plurality of first fixation holes are provided in the connecting rod along a longwise direction of the connecting rod and uniformly spaced apart from each other;
   a second fixation hole is disposed in a side wall of the first sleeve;
   when the first sleeve is moved up and down with respect to the connecting rod, the second fixation hole corresponds to one of the first fixation holes, and a fixation member in turn passes through the second fixation hole and the first fixation hole so as to fix the first sleeve to the connecting rod.

8. The baffle device according to claim 5, wherein the guiding portion is elastic, and the collection device further comprises:
   a second sleeve movably jacketing the connecting rod in an upper and lower direction; and
   a plurality of connecting plates, a first end of each connecting plate being connected to a lower end of the second sleeve, and the plurality of connecting plates being radially distributed, wherein a second end of each connecting plate is connected with the guiding portion.

9. The baffle device according to claim 8, wherein a plurality of first fixation holes are provided in the connecting rod along a longwise direction of the connecting rod and uniformly spaced apart from each other;
   a third fixation hole disposed in a side wall of the second sleeve;
   when the second sleeve is moved up and down with respect to the connecting rod, the third fixation hole corresponds to one of the first fixation holes, and a fixation member in turn passes through the third fixation hole and the first fixation hole so as to fix the second sleeve to the connecting rod.

10. The baffle device according to claim 1, wherein a plurality of the collection devices are provided, the plurality of the collection devices comprising a plurality of first collection devices and a plurality of second collection devices, wherein a radial distance between the guide face of the guiding portion of the first collection device and the connecting rod is not equal to a radial distance between the guide face of the guiding portion of the second collection device and the connecting rod, and the first collection devices and the second collection devices are arranged alternately on the baffle plate.

11. The baffle device according to claim 1, wherein a plurality of the collection devices are provided on the baffle plate and spaced apart from each other, wherein a radial distance between the guide face of the guiding portion of the collection device closer to a center of the baffle plate and the connecting rod is larger than a radial distance between the guide face of the guiding portion of the collection device further from the center of the baffle plate and the connecting rod.

12. The baffle device according to claim 1, wherein extension directions of the connecting rods of the collection devices are configured to be different from each other and the connecting rod of each of the collection devices is eccentric with respect to the guiding portion.

13. The baffle device according to claim 1, wherein the connecting rod is rotatably provided on the baffle plate and an angle between the connecting rod and the baffle plate is adjustable.

14. The baffle device according to claim 13, wherein each collection device further comprises an adjustment rod, one end of which is fixed to the connecting rod and the other end of which is connected to the baffle plate and is rotatable along a circumferential direction of the connecting rod, and an extension length of the adjustment rod is adjustable.

15. The baffle device according to claim 14, wherein the adjustment rod comprises:
a first adjustment portion of a hollow shape, one end of the first adjustment portion being fixed to the connecting rod; and
a second adjustment portion, one end of the second adjustment portion being connected to the baffle plate and rotatable along the circumferential direction of the connecting rod, and the other end of the second adjustment portion is fitted in the first adjustment portion and in slidable fit with the first adjustment portion.

16. The baffle device according to claim 1, wherein the baffle device further comprises a fixation frame,
the baffle plate is provided on top of the fixation frame; and
the fixation frame is provided with a plurality of mesh holes, two adjacent ones of which are spaced apart by a connecting rib.

17. An evaporation apparatus comprising:
an evaporation box, in which an evaporation chamber and an accommodating chamber are provided and spaced apart from each other;
an evaporation ejection source, located within the evaporation chamber and used for ejecting evaporation material; and
the baffle device for the evaporation apparatus according to claim 1.

* * * * *

UNITED STATES PATENT AND TRADEMARK OFFICE
CERTIFICATE OF CORRECTION

PATENT NO. : 10,711,340 B2
APPLICATION NO. : 15/821065
DATED : July 14, 2020
INVENTOR(S) : Da Zhou, Zailong Mo and Qun Ma Page 1 of 1

It is certified that error appears in the above-identified patent and that said Letters Patent is hereby corrected as shown below:

On the Title Page

Item (71), Applicant:
Delete "Suchuan"
Insert -- Sichuan --

Signed and Sealed this
First Day of September, 2020

Andrei Iancu
*Director of the United States Patent and Trademark Office*